(12) United States Patent
Huang

(10) Patent No.: US 10,756,054 B1
(45) Date of Patent: Aug. 25, 2020

(54) SEMICONDUCTOR PACKAGE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/521,526

(22) Filed: Jul. 24, 2019

(51) Int. Cl.
*H01L 21/56* (2006.01)
*H01L 23/00* (2006.01)

(52) U.S. Cl.
CPC ............ *H01L 24/97* (2013.01); *H01L 21/568* (2013.01); *H01L 24/19* (2013.01); *H01L 24/23* (2013.01)

(58) Field of Classification Search
CPC ....... H01L 24/97; H01L 24/23; H01L 21/568; H01L 24/19; H01L 21/56; H01L 23/28; H01L 31/0203; H01L 31/048; H01L 33/52; H01L 23/29; H01L 23/3164; H01L 31/0488; H01L 33/56; H01L 23/295; H01L 23/3135; H01L 31/92; H01L 23/296; H01L 23/293; H01L 23/291
See application file for complete search history.

(56) References Cited

U.S. PATENT DOCUMENTS

| 6,555,906 B2 | 4/2003 | Towle et al. |
| 10,163,858 B1 * | 12/2018 | Liu .................. H01L 24/83 |
| 2010/0258921 A1 * | 10/2010 | Chang Chien ...... H01L 23/3107 257/676 |
| 2019/0288169 A1 * | 9/2019 | Wakaki .................. H01L 33/52 |

FOREIGN PATENT DOCUMENTS

CN          1316604 C          5/2007

* cited by examiner

*Primary Examiner* — Thanh T Nguyen
(74) *Attorney, Agent, or Firm* — Foley & Lardner LLP

(57) ABSTRACT

A semiconductor package includes a core layer having a first surface and a second surface opposite to the first surface. The core layer includes a cavity. A first die is in the cavity. A first gap is between a sidewall of the cavity and a sidewall of the first die. A filling material is in the first gap. The filling material includes a first dimple in proximal to the second surface of the core layer. A first buffer layer on the second surface of the core layer. The first buffer layer has a bottom surface in proximal to the first die and a top surface opposite to the bottom surface. The first buffer layer filling the first dimple. A method for manufacturing a semiconductor package is also disclosed.

20 Claims, 18 Drawing Sheets

US 10,756,054 B1

SEMICONDUCTOR PACKAGE AND METHOD FOR MANUFACTURING THE SAME

BACKGROUND

1. Technical Field

The present disclosure relates to a semiconductor package having an embedded die.

2. Description of the Related Art

Semiconductor packages are used for protecting an integrated circuit (IC) chip or die, and also to provide the die with an electrical interface to external circuitry. With the increasing demand for smaller electronic devices, semiconductor packages are designed to be even more compact and to support larger layout density. For example, some semiconductor packages use a coreless substrate, which does not include the thick resin core layer found in certain substrates. Furthermore, the demand for higher performance devices results in a demand for an improved semiconductor package that allows mixed technology die stacking or provide package stacking capability while maintaining a thin packaging profile.

SUMMARY

In some embodiments, the present disclosure provides a semiconductor package including a core layer having a first surface and a second surface opposite to the first surface. The core layer includes a cavity. A first die is in the cavity. A first gap is between a sidewall of the cavity and a sidewall of the first die. A filling material is in the first gap. The filling material includes a first dimple in proximal to the second surface of the core layer. A first buffer layer on the second surface of the core layer. The first buffer layer has a bottom surface in proximal to the first die and a top surface opposite to the bottom surface. The first buffer layer filling the first dimple.

In some embodiments, the present disclosure provides a semiconductor package including a core layer having a first surface and a second surface opposite to the first surface. The core layer includes a cavity. A first die disposed in the cavity. A first gap is between a sidewall of the cavity and a sidewall of the first die. A filling material is in the first gap. The filling material includes a first dimple in proximal to the second surface of the core layer. A buffer layer is on the second surface of the core layer and filling the first dimple. An insulation layer is stacked on the buffer layer. A conductive via penetrates the buffer layer and the insulation layer, and electrically connected to the first die. The conductive via includes a first width in the buffer layer and a second width at a boundary between the buffer layer and the insulation layer. The first width is greater than the second width.

In some embodiments, the present disclosure provides a method for manufacturing a semiconductor package, the method includes providing a carrier, forming a core layer on the carrier, the core layer including a cavity extending from a first surface of the core layer to a second surface of the core layer opposite to the first surface. The first surface of the core is closer to the carrier than to the second surface. Placing a first die into the cavity and forming a first gap between a sidewall of the cavity and a sidewall of the first die. Filling a dielectric with a first viscosity into the first gap, wherein a first dimple is formed in the first gap and adjacent to the second surface of the core layer. Forming a dielectric with a second viscosity on the second surface of the core layer and filling into the first dimple of the dielectric with the first viscosity. The first viscosity is smaller than the second viscosity.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
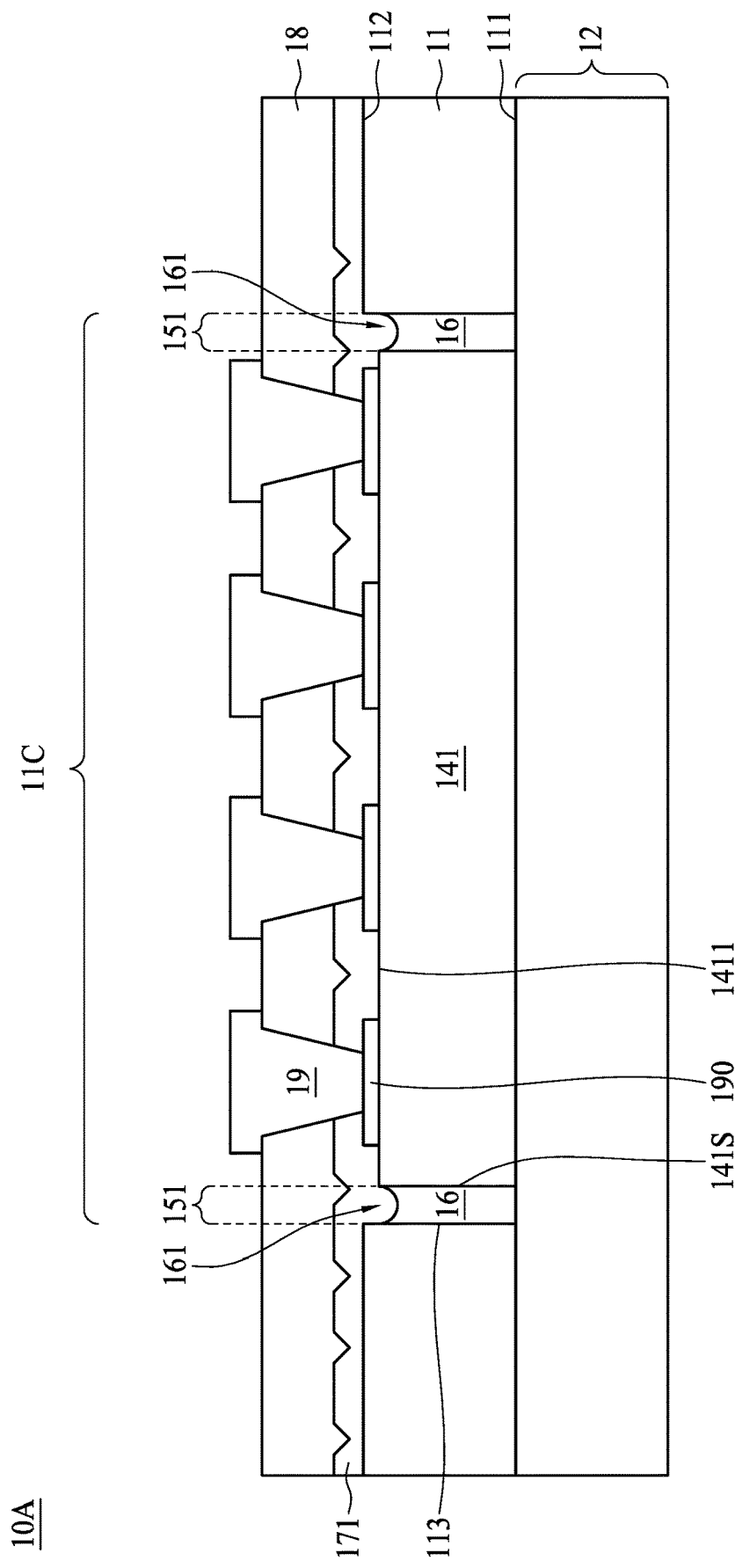
FIG. 1A illustrates a cross-sectional view of a semiconductor package, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

To maintain a thin semiconductor package profile, active chips or passive chips may be embedded in a substrate, for example, an organic core substrate. In the embedded chip technology, a cavity is first defined in the substrate, and the chips to be embedded are then disposed into the cavity. When the space between embedded chips and the sidewall of the cavity is within a specific range, for example, between 150 μm and 500 μm, the space or gap may not be filled by the materials subsequently formed over the substrate and the embedded chips, for example, pre-impregnated (pre-preg) laminates. A flowable dielectric can be applied to first fill the space or gap between embedded chips and the sidewall of the cavity prior to applying the pre-preg laminates. However, the more fluidic the dielectric the greater the solvent content. After the baking operation of the flowable dielectric, the solvent volatilize and leaving dimples on the space or gap. In some comparative embodiments, the dimples has a depth of from about 5 μm to 10 μm. Such dimples create a non-uniform surface and the dimpled shape may carry to the pre-preg laminates subsequently formed over the embedded chips and the substrate. Fabrication of the substrate over the embedded chip level includes a plurality of lamination operations, which cannot be readily carried on over such dimpled surface.

Present disclosure provides a semiconductor package with embedded chips. A buffer layer is filled over the embedded chips and the substrate after the application of the flowable dielectric and prior to the lamination of pre-preg. The buffer layer allows the formation of a substantially flat surface that is friendly for fabrication of the substrate over the embedded chip level. In some embodiments, the fluidity of the buffer layer is greater than the pre-preg and lesser than the flowable dielectric. In some embodiments, a viscosity of the buffer layer under high temperature, e.g., over 100° C. is greater than the flowable dielectric and lower than the pre-preg. In some embodiments, the substantially flat surface of the buffer layer possesses a dimple with a depth smaller than 2 μm.

Referring to FIG. 1A, FIG. 1A illustrates a cross-sectional view of a semiconductor package 10A, according to some embodiments of the present disclosure. The semiconductor package 10A includes a substrate layer, for example, a core layer 11 composed of a core substrate in which a cavity 11C is pre-formed. The core layer 11 has a firs surface 111 proximal to a carrier 12 and the second surface 112, which is opposite to the first surface 111, distal to the carrier 12. The carrier 12 may have several forms, for example, a lead frame, an organic carrier having conductive traces, or a redistribution layer (RDL) structure. A first die 141 is positioned in the cavity 11C, at least a top surface 1411 of the first die 141 is exposed from the core layer 11. The first die 141 can be an active die or a passive die. Top surface 1411 of the first die 141 may be lower than the second surface 112 of the core layer 11. A conductive pad 190 adjacent to, or embedded and exposed from the top surface 1411 of the first die 141 may have a top surface lower than the second surface 112 of the core layer 11.

In some embodiments, the cavity 11C accommodates one semiconductor die, and a first gap 151 can be observed between a sidewall 141S of the first die 141 and a sidewall 113 of the cavity 11C. A filling material 16 is filled in the first gap 151 in order to prevent the first die 141 in the cavity 11C from moving, as the cavity may have a greater area than the first die 141. In some embodiments the filling material 16 may include an undercoat ink having a viscosity of from about 300 to about 400 Poise.

Due to the fact that the fluidity of the filling material 16 has to be sufficiently good in order to fill the first gap 151, after the baking operation, solvent in the filling material 16 volatizes and leaving a first dimple 161 proximal to the top surface 1411 of the first die 141 or the second surface 112 of the core layer 11. To save the real estate of the semiconductor package, the first gap 151 may have a transverse dimension of less than 500 μm. In some embodiments, the transverse dimension of the first gap 151 may be in a range of from about 150 μm to 500 μm. Under such condition, a depth of the first dimple 161 is about 5 μm to 10 μm, which may unduly hinder subsequent lamination operations over the first die 141, the core layer 11, and the first dimple 151 itself.

The transverse dimension of the first gap 151 may be in a range of from about 150 μm to 500 μm. When the transverse dimension of the first gap 151 is narrower than 150 μm, the amount of the filling material 16 in the gap is small enough that even after the volatilization of the solvent in the filling material 16, no prominent dimple may be formed. When the transverse dimension of the first gap 151 is greater than 500 μm, the amount of the filling material 16 in the gap is large enough that after the volatilization of the solvent in the filling material 16, the dimple may have a nominal depth close to a smooth surface. When the transverse dimension of the first gap 151 is in a range of from about 150 μm to 500 μm, after the volatilization of the solvent in the filling material 16, the dimple becomes prominent and the depth of the dimple (e.g., from 5 μm to 10 μm) leads to a substantial non-planar surface problematic to the subsequent lamination operations.

The semiconductor package 10A further includes a first buffer layer 171 over the second surface 112 of the core layer 11. A bottom surface of the first buffer layer 171 conforms to the underlying morphology, that is, the second surface 112 of the core layer 11, the top surface 1411 of the first die 141, and the first dimple 161 between the first die 141 and the core layer 11. The bottom surface of the first buffer layer 171 is closer to the second surface 112 of the core layer 11 than a top surface of the first buffer layer 171. The top surface of the first buffer layer 171 is substantially flat compared to the bottom surface of the first buffer layer 171. In some embodiments the first buffer layer 171 may include an adhesive build-up film (ABF) having a viscosity of about 3000 to 4000 Poise, for example, at an elevated temperature of 129° C. The first buffer layer 171 becomes fluidic at the elevated temperature, so that the top surface of the first buffer layer 171 may be substantially flat while the bottom surface of the first buffer layer 171 filling the space of the first dimple 161. In some embodiments, the first buffer layer 171 fills the entire space of the first dimple 161 without trapping air voids. In some embodiments, the top surface of the buffer layer 171 may include a less prominent dimple having a depth, for example, less than about 2 μm. In some embodiments, to enhance the adhesive property of the buffer layer 171 with the subsequent laminates, a surface roughness (e.g., Ra<0.9 μm and Rz<1.3 μm) may be created by a surface roughening operation.

The semiconductor package 10A further includes a first insulation layer 18 over the first buffer layer 171 or in contact with the top surface of the first buffer layer 171. In some embodiments, the first insulation layer 18 may be pre-impregnated (pre-preg) dielectric including thermoset polymer such as epoxy. The viscosity of the first insulation layer 18 may be greater than the viscosity of the filling material 16 and the viscosity of the first buffer layer 171. In some embodiments, as previously described, the first insulation layer 18 fills the roughened surface and the less prominent dimple on the top surface of the first buffer layer 171.

Figure 1B:
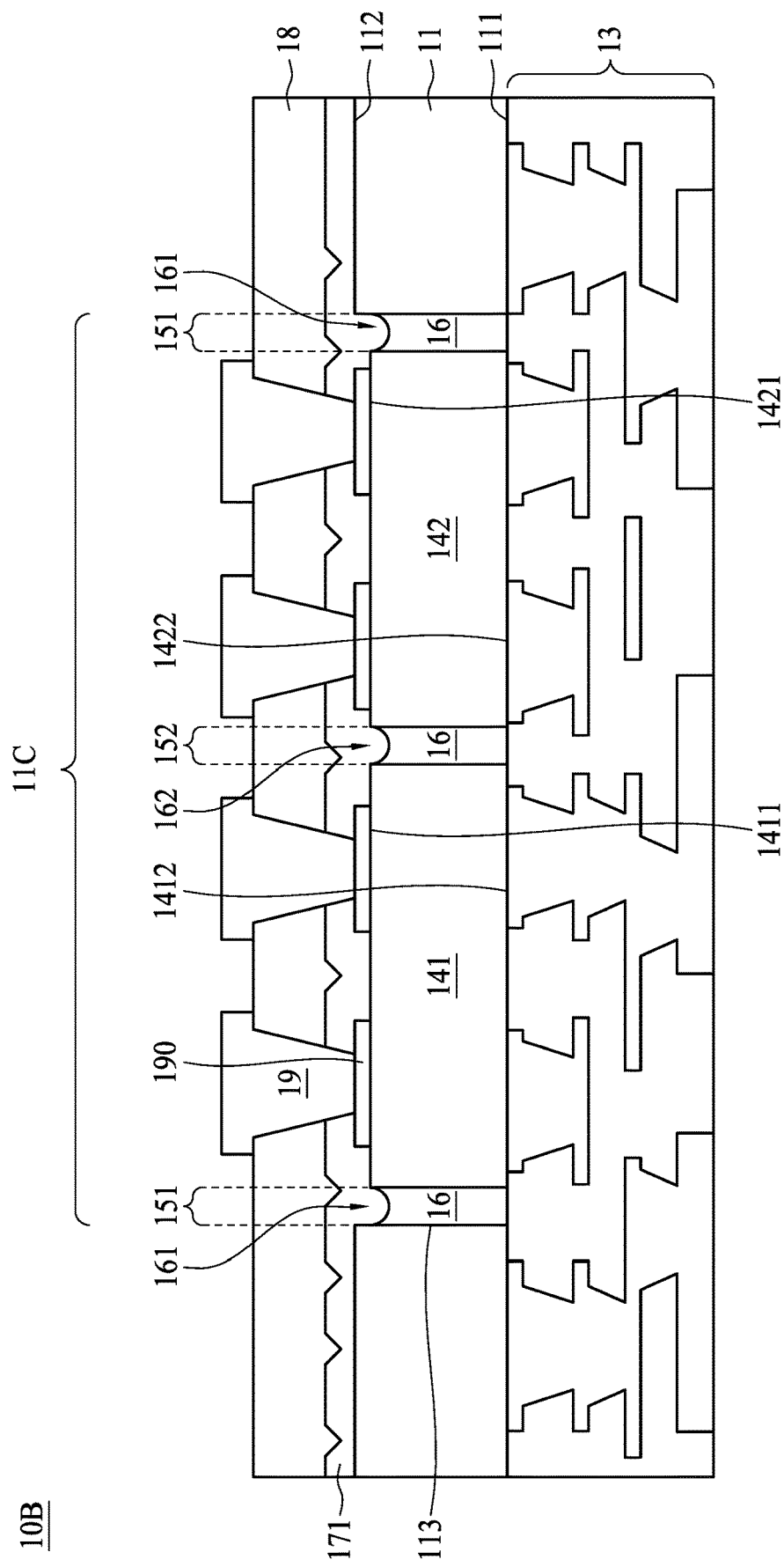
FIG. 1B illustrates a cross-sectional view of a semiconductor package, according to some embodiments of the present disclosure.

Referring to FIG. 1B, FIG. 1B illustrates a cross-sectional view of a semiconductor package 10B, according to some embodiments of the present disclosure. The semiconductor package 10B is similar to the semiconductor package 10A except that a second die 142 is also disposed in the cavity 11C, and a carrier 13 of the semiconductor package 10B can be a conductive trace structure such as an RDL. A top surface 1421 of the second die 142 is exposed from the core layer 11. The second die 142 can be an active die or a passive die. Top surface 1421 of the second die 142 may be lower than the second surface 112 of the core layer 11. A conductive pad 190 adjacent to, or embedded and exposed from the top surface 1421 of the second die 142 may have a top surface lower than the second surface 112 of the core layer 11.

In some embodiments, the cavity 11C accommodates more than one dies, and a second gap 152 can be observed between a sidewall of the first die 141 and a sidewall of the second die 142. A filling material 16 is filled in the second gap 152 in order to prevent the first die 141 and the second die 142 in the cavity 11C from moving, as the cavity may have a greater area than the first die 141 and the second die 142 combined. In some embodiments, the filling material 16 may include an undercoat ink having a viscosity of from about 300 to about 400 Poise.

Due to the fact that the fluidity of the filling material 16 has to be sufficiently good in order to fill the first gap 151, after the baking operation, solvent in the filling material 16 volatizes and leaving a second dimple 162 proximal to the top surface 1421 of the second die 142. To save the real estate of the semiconductor package, the second gap 152 may have a transverse dimension of less than 500 µm. In some embodiments, the transverse dimension of the second gap 152 may be in a range of from about 150 µm to 500 µm. Under such condition, a depth of the second dimple 152 is about 5 µm to 10 µm, which may unduly hinder subsequent lamination operations over the first die 141, the second die 142, the core layer 11, the first dimple 151, and the second dimple 152.

Also shown in FIG. 1B, the carrier 13 appears as an RDL electrically coupled to at least one of the first die 141 and the second die 142. The RDL is disposed on the first surface 111 of the core layer and electrically connected to the embedded dies. When any of the first die 141 and the second die 142 is an active die, the RDL may be electrically coupled to an active surface thereof through, for example, a through silicon via or a through substrate via, depending on various connection designs. When any of the first die 141 and the second die 142 is a passive die, the RDL may be electrically coupled to the bottom surface 1412 of the first die 141 or the bottom surface 1422 of the second die 142.

In FIG. 1B, at the top surface 1411 and the top surface 1421 of the first die 141 and second die 142, respectively, a trace structure 19 can be formed in the first buffer layer 171 and the first insulation layer 18. In some embodiments, the trace structure 19 can be a through via penetrating the first buffer layer 171 and the first insulation layer 18, and further electrically connected to the embedded dies through the conducive pad 190.

Figure 1C:
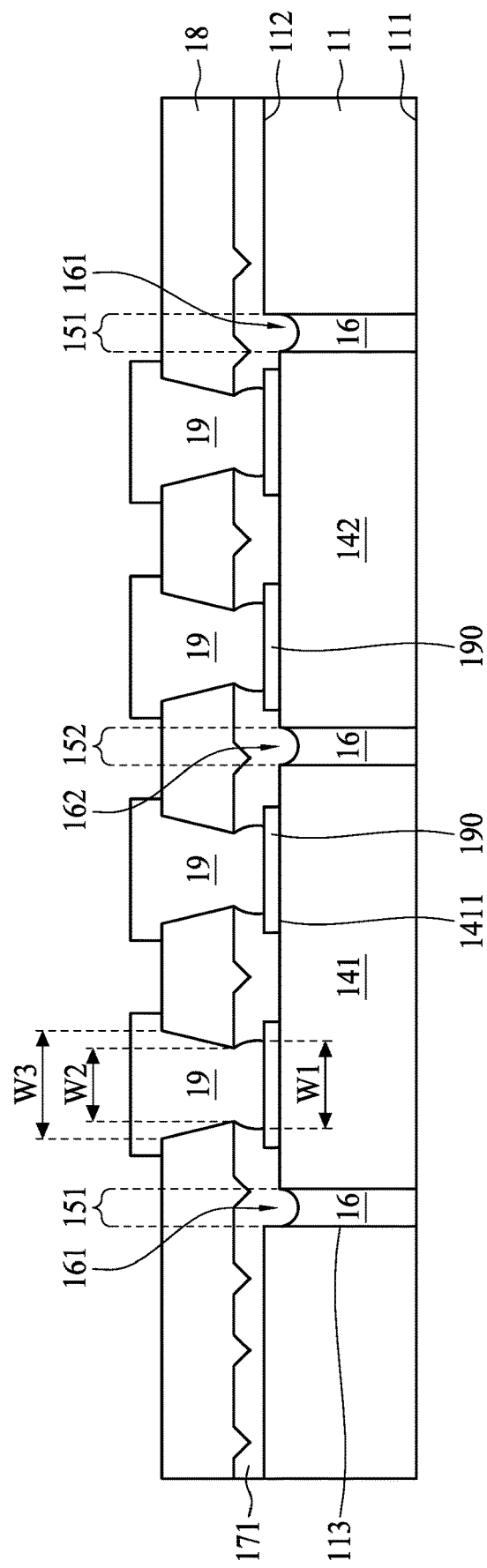
FIG. 1C illustrates a cross-sectional view of an enlarged portion of a semiconductor package, according to some embodiments of the present disclosure.

Referring to FIG. 1C, FIG. 1C illustrates a cross-sectional view of an enlarged portion of a semiconductor package 10B, according to some embodiments of the present disclosure. The trace structure 19 penetrating the first buffer layer 171 and the first insulation layer 18 may possess different width at various locations. For example, a first width W1 of the trace structure 19 is measured in the first buffer layer 171 where the trace structure 19 interfacing with the conductive pad 190. A second width W2 of the trace structure 19 is measured at a boundary between the first buffer layer 171 and the first insulation layer 18. It can be observed that the second width W2 is smaller than the first width W1. The trace structure 19 may be formed by a laser drilling operation removing a predetermined portion of the first buffer layer 171 and the first insulation layer 18 in a single laser drilling operation. In some embodiments, the first buffer layer 171 is easier to be removed by laser drilling than the first insulation layer 18. The laser beam may be focused and aligned with the location of the conductive pad 190 as a drilling stop when the laser beam irradiates from a top surface of the first insulation layer 1. The laser beam can be reflected by the conductive pad 190 and thereby enhance the removing effect in the portion of the first buffer layer 171 near the conductive pad 190. Because the reflected laser beam may be lack of directionality, the bottom portion of the conductive trace 19 near the conductive pad 190 is tapered out compared to the same at the boundary of the first insulation layer 18 and the first buffer layer 171.

In addition, a third width W3 of the trace structure 19 is measured at a top surface of the first insulation layer 18. In some embodiments, the third width W3 is greater than the second width W2. In some embodiments, the third width W3 is greater than the first width W1.

Figure 1D:
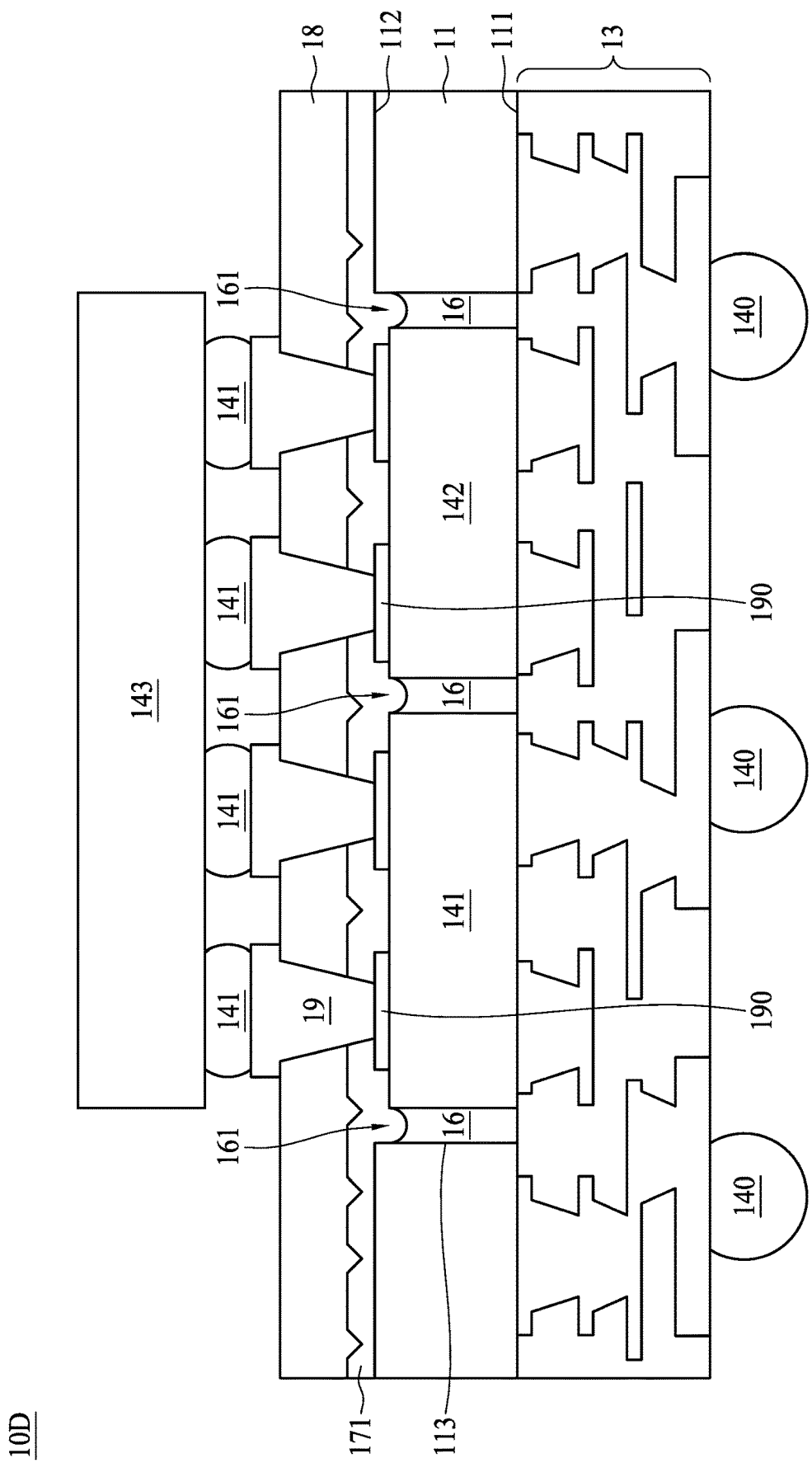
FIG. 1D illustrates a cross-sectional view of a semiconductor package, according to some embodiments of the present disclosure.

Referring to FIG. 1D, FIG. 1D illustrates a cross-sectional view of a semiconductor package 10D, according to some embodiments of the present disclosure. The semiconductor package 10D is similar to the semiconductor package 10B except that a third die 143 is disposed over the cavity 11C and electrically connected to the embedded dies. In some embodiments, the third die 143 may have an active surface facing down and flip-chip bonded to the trace structure 19 in the first insulation layer 18 and the first buffer layer 171. Solder connection 141 may be formed in the flip-chip bonding configuration. However, other types of configuration applicable to flip-chip bonding may be contemplated as within the scope of the present disclosure.

Solder bumps 140 can be formed at the carrier 13 side of the semiconductor package 10D, as illustrated in FIG. 1D. In some embodiments, the solder bumps 140 are electrically connected to the conducive trace terminal of the RDL and configured to from electrical connection to external components such as a printed circuit board (PCB).

Figure 2:
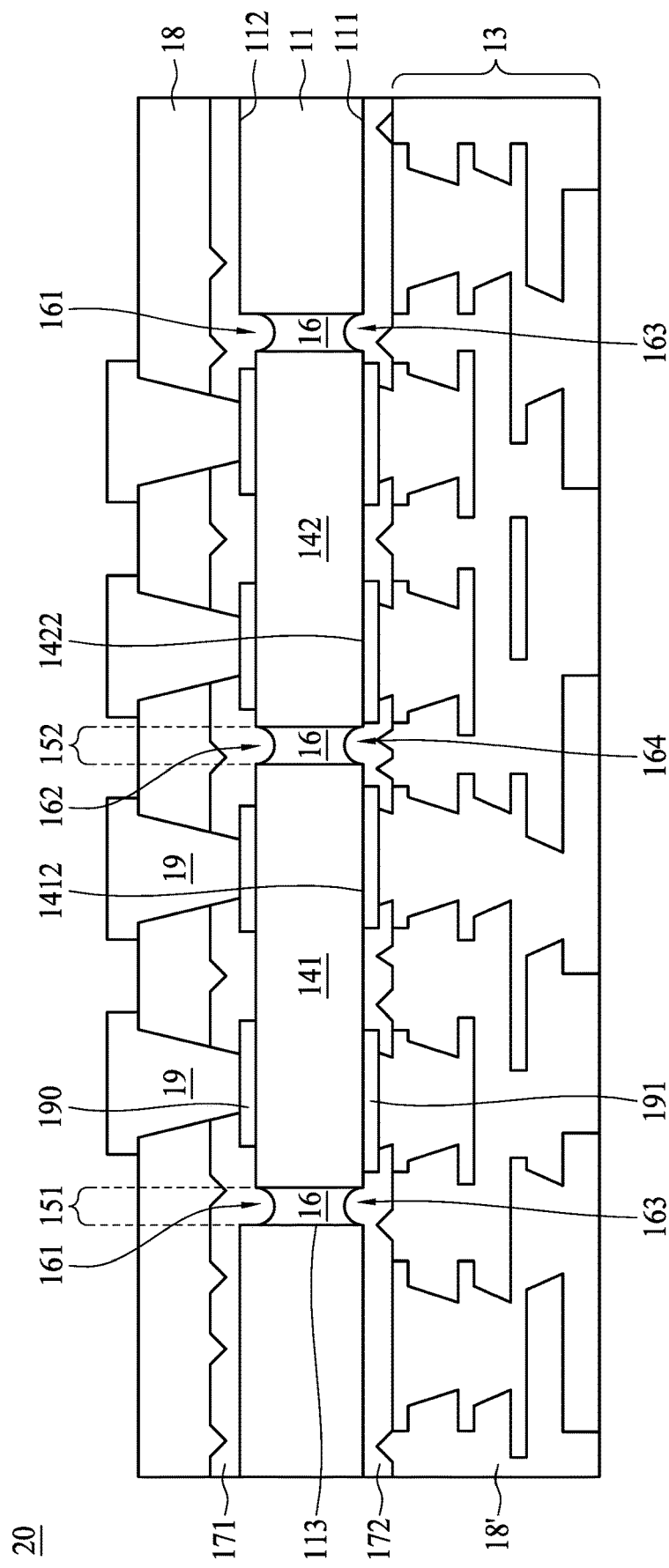
FIG. 2 illustrates a cross-sectional view of a semiconductor package, according to some embodiments of the present disclosure.

Referring to FIG. 2, FIG. 2 illustrates a cross-sectional view of a semiconductor package 20, according to some embodiments of the present disclosure. The semiconductor package 20 is similar to the semiconductor package 10B except that a second buffer layer 172 is formed at a bottom surface 1412 of the first die 141, a bottom surface 1422 of the second die 142, and the first surface 111 of the core layer 11. The second buffer layer 172 is positioned between the embedded dies and the carrier 13, for example, an RDL. The first die 141 and the second die 142 in the semiconductor package 20 may be passive devices where a thickness of the passive device is normally thicker than an active device. As such, the dimples 161, 162, and 163 in the semiconductor package 20 may possess a greater, or deeper, dimension. Due to the fact that the fluidity of the filling material 16 has to be sufficiently good in order to fill the first gap 151 and the second gap 152, after the baking operation, solvent in the filling material 16 volatizes and leaving a third dimple 163 and a fourth dimple 164 proximal to the bottom surface 1412 of the first die 141, the bottom surface 1422 of the second die 142, and the first surface 111 of the core layer 11.

The second buffer layer 172 may be composed of essentially identical material as the first buffer layer 171. The second buffer layer 172 becomes fluidic at the elevated temperature, so that the surface of the second buffer layer 172 away from the embedded dies may be substantially flat while the surface of the second buffer layer 172 engaging with the embedded dies filling the space of the third dimple 163 and the fourth dimple 164. In some embodiments, the second buffer layer 172 fills the entire space of the third dimple 163 and the fourth dimple 164 without trapping air voids. In some embodiments, the surface of the second buffer layer 172 away from the embedded dies may include a less prominent dimple having a depth, for example, less than about 2 μm. In some embodiments, to enhance the adhesive property of the second buffer layer 172 with the subsequent laminates, a surface roughness (e.g., Ra<0.9 μm and Rz<1.3 μm) may be created by a surface roughening operation.

One or more conductive pads 191 may be disposed on the second surface 1412 of the first die 141 and the second surface 1422 of the second die 142. In some embodiments, the second surface 1412 of the first die 141 and the second surface 1422 of the second die 142 may be leveled with the first surface 111 of the core layer 11, therefor, the one or more conductive pads 191 which are adjacent to, or embedded and exposed from the second surfaces 1412, 1422 may protrude from the first surface 111 of the core layer 11.

The semiconductor package 20 further include a second insulation layer 18' stacked with the second buffer layer 172 or in contact with the surface of the buffer layer 17 away from the embedded dies. In some embodiments, the second insulation layer 18' may be pre-impregnated (pre-preg) dielectric including thermoset polymer such as epoxy. The viscosity of the second insulation layer 18' may be greater than the viscosity of the filling material 16 and the viscosity of the second buffer layer 172. In some embodiments, as previously described, the second insulation layer 18' fills the roughened surface and the less prominent dimple on the surface of the second buffer layer 172 away from the embedded dies.

Because the semiconductor package 20 further include a second buffer layer 172 at the second surfaces 1412, 1422 of the embedded dies 141, 142, the entire package structure is more balanced with respect to warpage control. In addition, the second buffer layer 172 has a thickness greater than the conductive pads 191 at the second surfaces 1412, 1422 of the embedded dies 141, 142, the conducive pads 191 may be considered embedded in the second buffer layer 172, thereby providing protection to the conductive pads 191 during subsequent lamination operations, for example, the conductive pads 191 may not be directly contacted when stacking the second insulation layer 18' with the second buffer layer 172.

Figure 3:
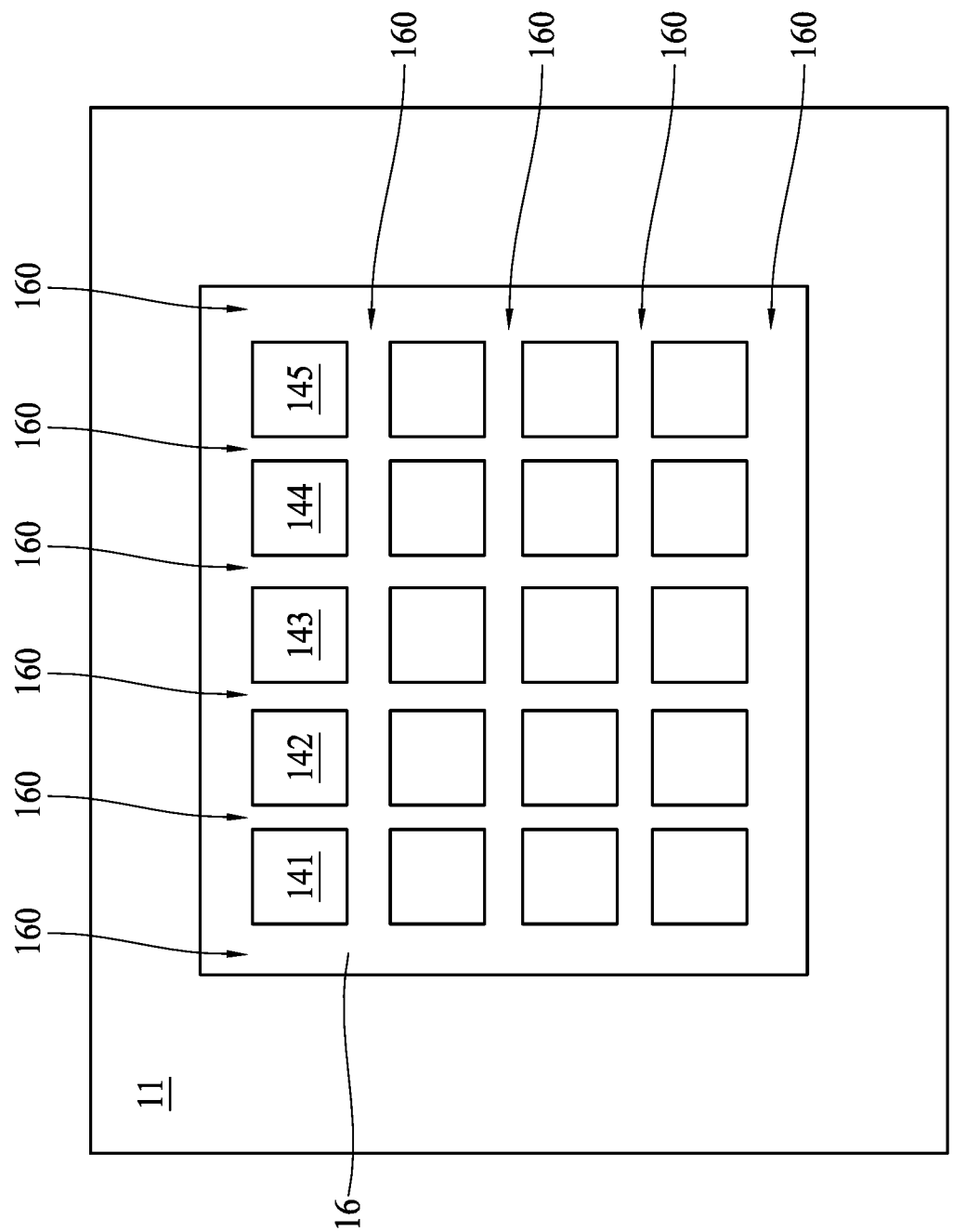
FIG. 3 illustrates a top view of a semiconductor package, according to some embodiments of the present disclosure.

Referring to FIG. 3, FIG. 3 illustrates a top view of a semiconductor package, according to some embodiments of the present disclosure. As previously disclose, more than one die may be disposed in the cavity defined by the core layer 11. In some embodiments, more than 60 dies (e.g., 66 dies) are positioned within a single cavity of the core layer 11. As shown in FIG. 3 where a four by five die array is disposed in a cavity of a core layer 11, filling material 16 fills the gaps or spaces between adjacent dies and the gap or spaces between dies and the sidewall of the core layer 11. Dimples 161 and 162 shown in previous figures appear as various recess trenches 160 between adjacent dies and between dies and core layer 11, from a top view perspective.

Figure 4A:
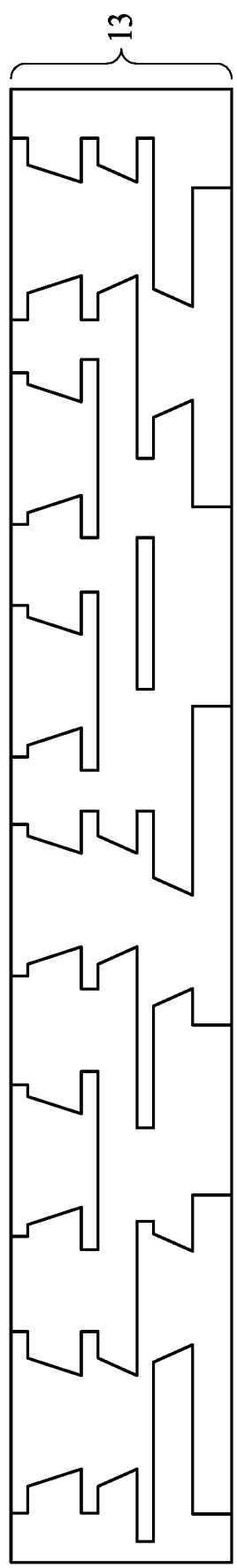
FIG. 4A, FIG. 4B, FIG. 4C, FIG. 4D, FIG. 4E, FIG. 4F, FIG. 4G, and FIG. 4H are cross-section views of a semiconductor package during various manufacturing operations, according to some embodiments of the present disclosure.
Figure 4B:
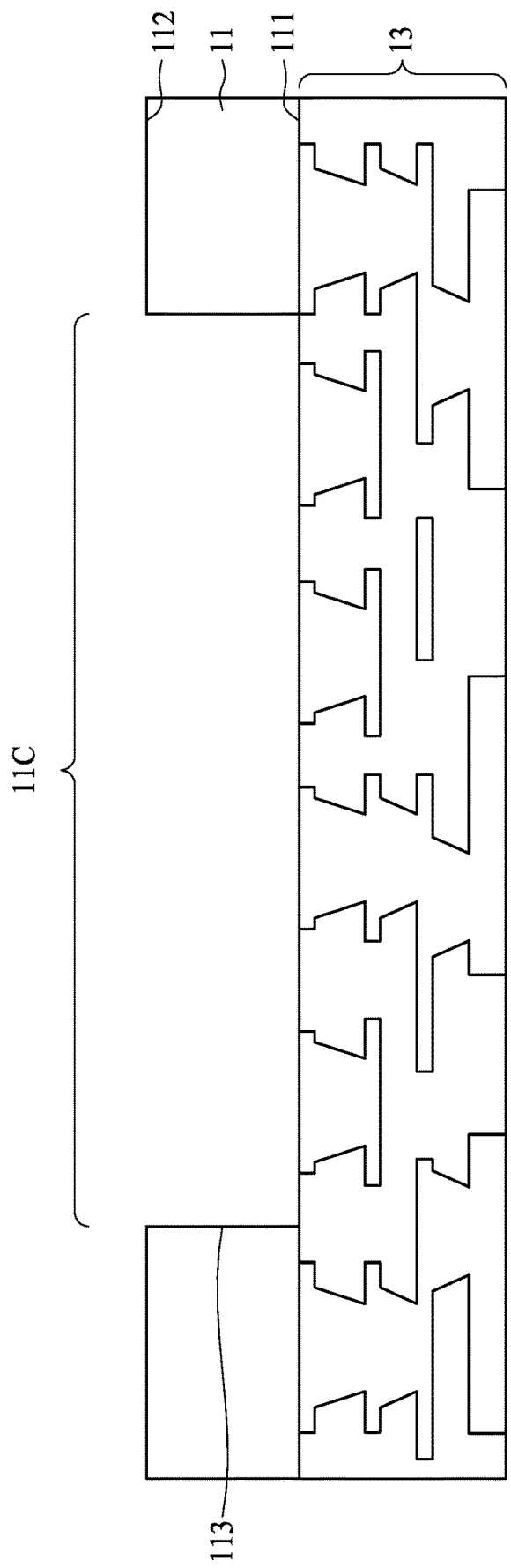
Figure 4C:
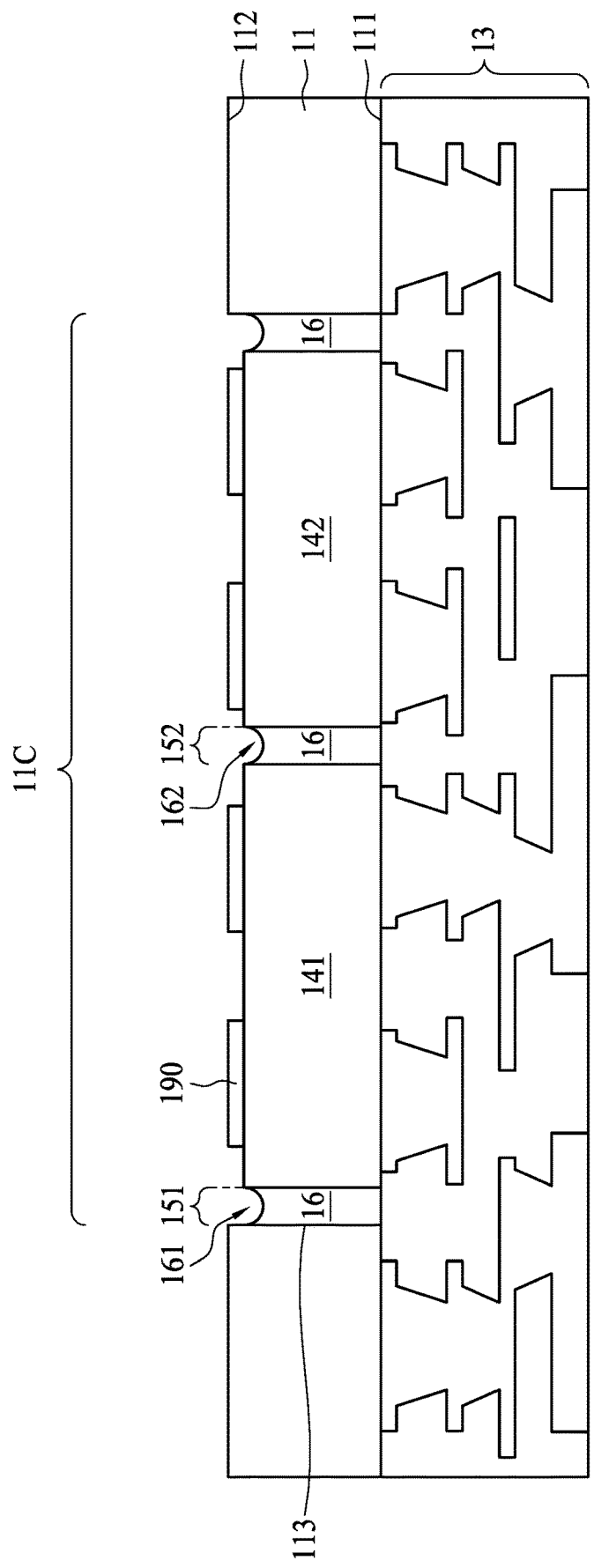

FIG. 4A to FIG. 4H are cross-section views of a semiconductor package 10B during various manufacturing operations, according to some embodiments of the present disclosure. In FIG. 4A, a carrier 13 may be provided. As previously addressed, the carrier can be a lead frame, an organic carrier having conductive traces, or a redistribution layer (RDL) structure. In FIG. 4B, a core layer 11 having at least one pre-defined cavity 11C is stacked over the carrier 13. The cavity 11C extends from the first surface 111 to the second surface 112 of the core layer 11. In FIG. 4C, a first die 141 is placed into the cavity 11C at a position allowing a first gap 151 to be formed between the sidewall of the core layer 11 and the sidewall of the first die 141. Optionally, a second die 142 may be placed into the cavity 11C at a position allowing a second gap 152 to be formed between the sidewall of the first die 141 and the sidewall of the first die 142.

Still referring to FIG. 4C, a dielectric with a first viscosity, or the filling material 16 referred herein, may be filled into the first gap 151. After a baking operation of the filling material 16, the solvent volatize and leaving a first dimple 151 and/or a second dimple 152 on the first gap 151 and second gap 152, respectively. In some embodiments, the dimples 161, 162 may have a depth of from about 5 μm to 10 μm. In some embodiments, when applying the filling material 16 into the first gap 151 and the second gap 152 (hereinafter the "gaps"), a vacuum environment is created such that no air bubbles in the gaps may prevent the filling material 16 from entering the gaps. Subsequently, the filling material 16 entering the gaps is baked in a pressurized oven to ensure after the volatilization of the solvent in the filling material 16, no air bubble is trapped within the gaps. This operation may prevent air bubble from trapping in the gaps during the filling material 16 formation and become a pressure center in subsequent elevated temperature operations.

Figure 4D:
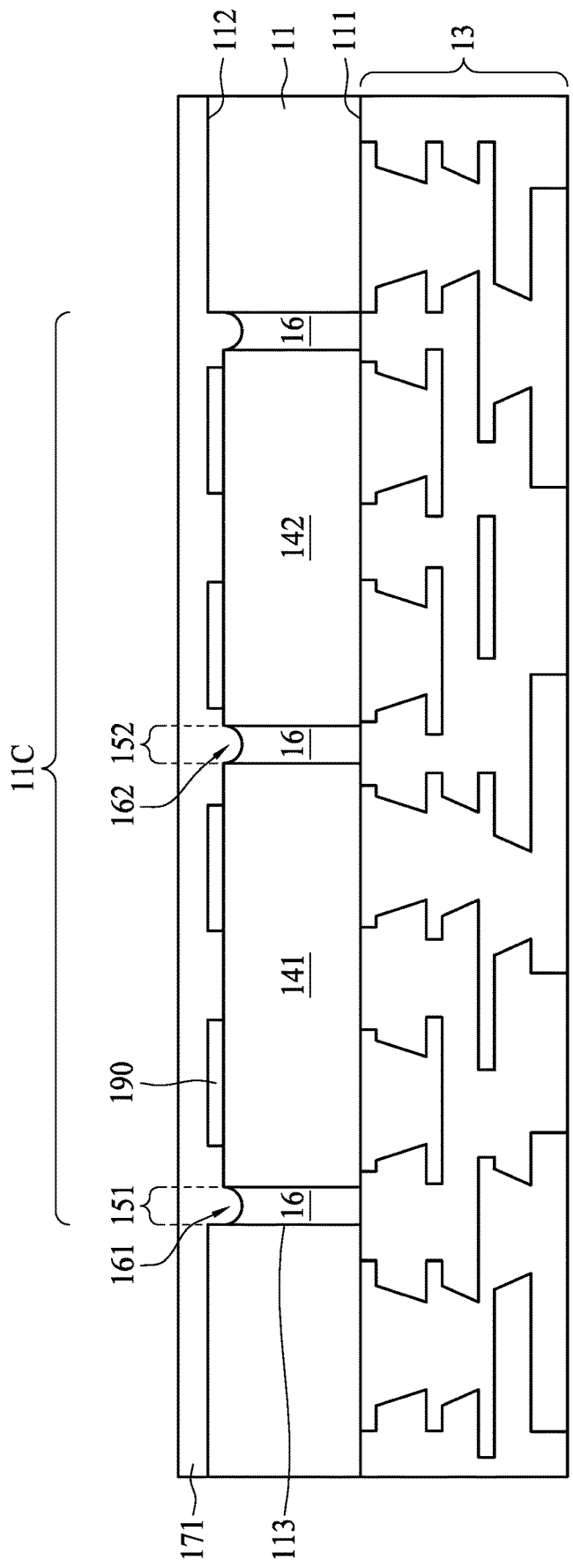
Figure 4E:
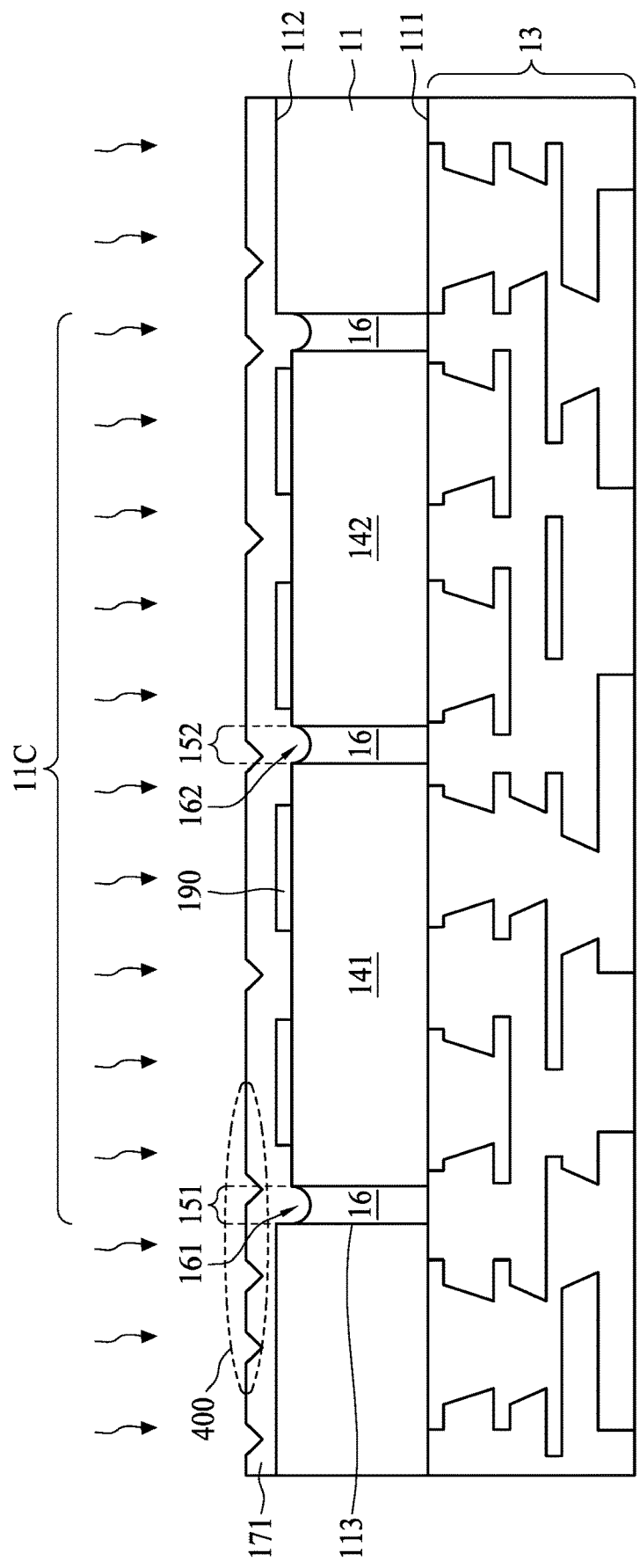
Figure 4F:
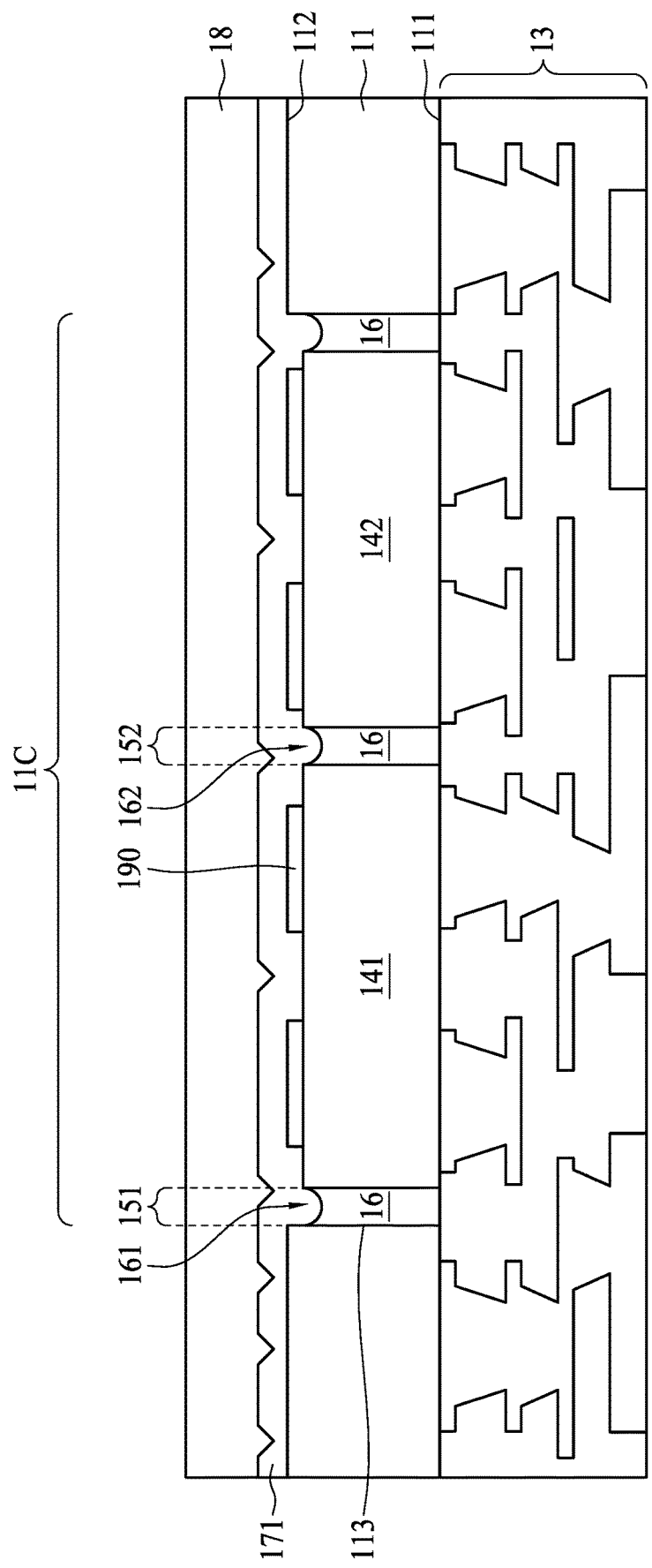

In FIG. 4D, a dielectric with a second viscosity, or the first buffer layer 171 referred herein, is formed on the second surface 112 of the core layer 11 and filling into the first dimple 161 and the second dimple 162. As previously discussed, the first viscosity is smaller than the second viscosity in order to obtain a better fluidity to fill a deeper gap. In FIG. 4D, a surface roughening operation is performed to roughen a top surface of the first buffer layer 171. A surface roughness 400 (e.g., Ra<0.9 μm and Rz<1.3 μm) can be obtained in order to provide better adhesion between the first buffer layer 171 and the subsequent laminates. In some embodiments, the surface roughening operation includes a plasma treatment. In FIG. 4F, a dielectric with a third viscosity, or the first insulation layer 18, is formed over the first buffer layer 171 with a roughened surface. As previously addressed, the third viscosity is greater than the second viscosity.

Figure 4G:
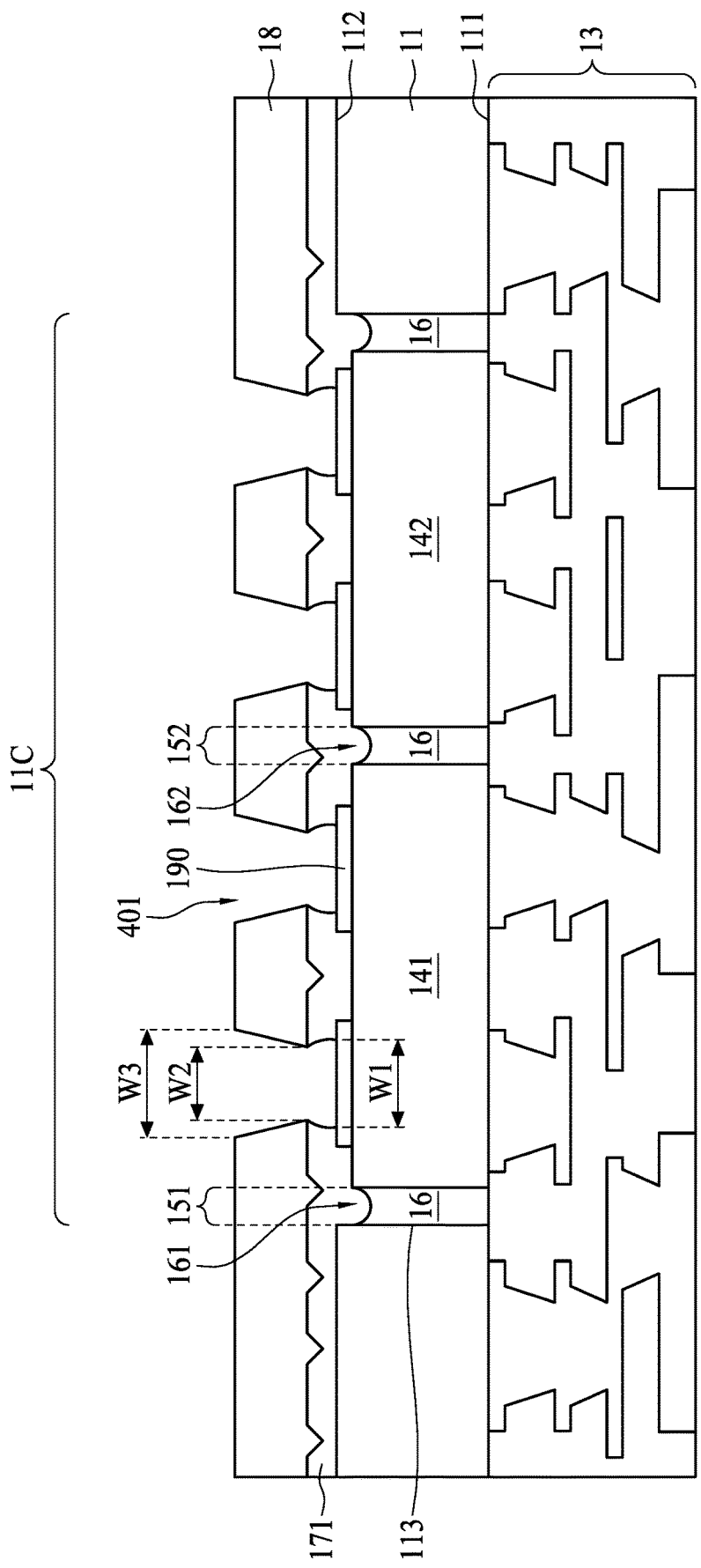
Figure 4H:
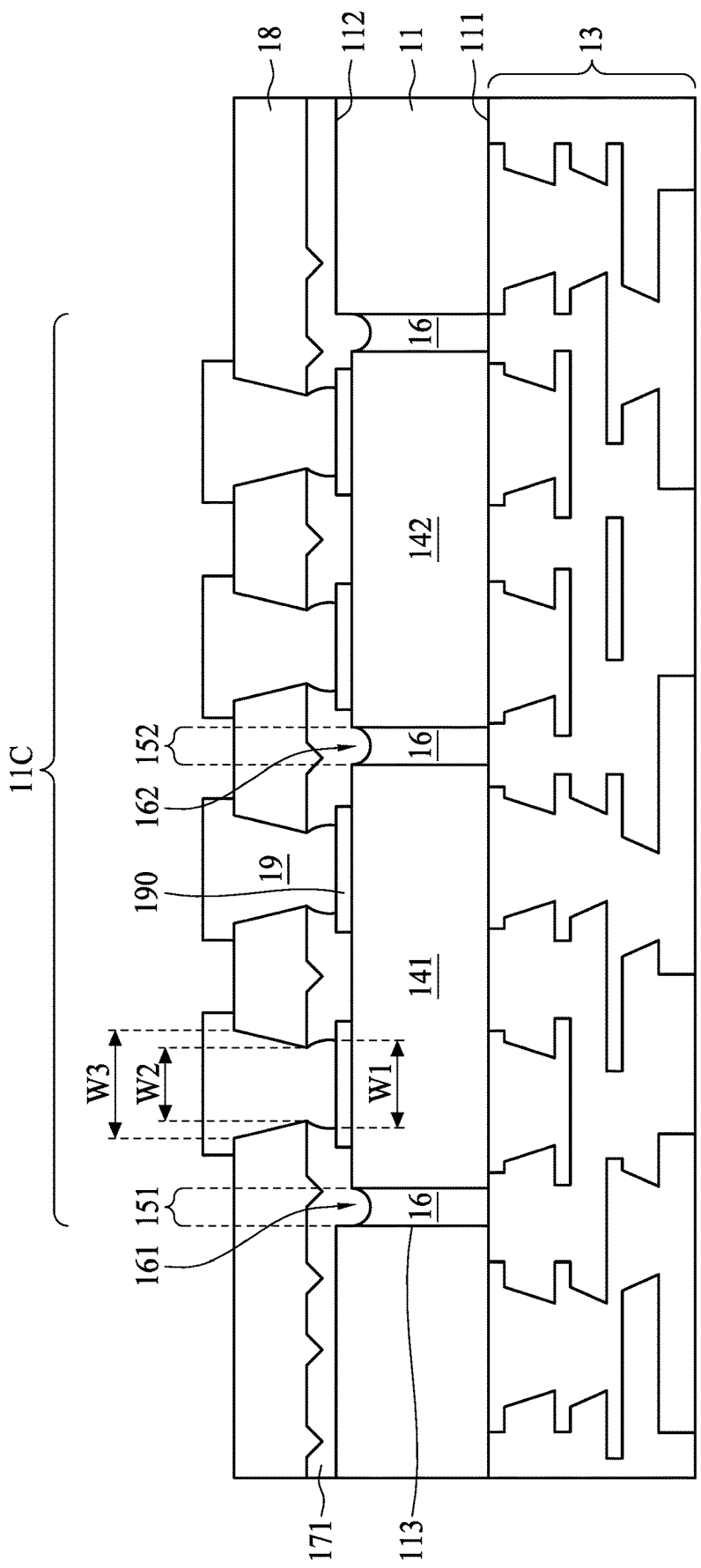

In FIG. 4G, more than one via holes 401 are formed in the first buffer layer 171 and the first insulation layer 18 by, for example, a laser drilling operation. Laser beam may be focused and aligned to the conductive pads 190 over the top surface 1411 of the first die 141 and creating a through hole in the first buffer layer 171 and the first insulation layer 18 by exposing the conductive pads 190. A cross sectional profile of the via hole 401 is illustrated in FIG. 4G. A first width W1 of the via hole 401 is measured in the first buffer layer 171 where the via hole 401 interfacing with the conductive pad 190. A second width W2 of the via hole 401 is measured at a boundary between the first buffer layer 171 and the first insulation layer 18. A third width W3 of the via hole 401 is measured at a top surface of the first insulation layer 18. In FIG. 4H, conductive material, such as copper, fills the via holes 401 and forming a trace structure 19 or conductive via having various widths W1, W2, W3 in the first buffer layer 171 and the first insulation layer 18. The trace structure 19 or conductive via is electrically coupled to the first die 141 and the second die 142 through the connection of the conductive pads 190.

Figure 5A:
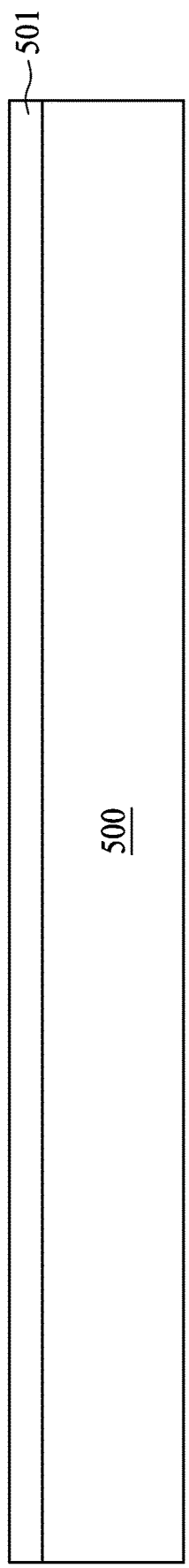
FIG. 5A, FIG. 5B, FIG. 5C, and FIG. 5D are cross-section views of a semiconductor package during various manufacturing operations, according to some embodiments of the present disclosure.
Figure 5B:
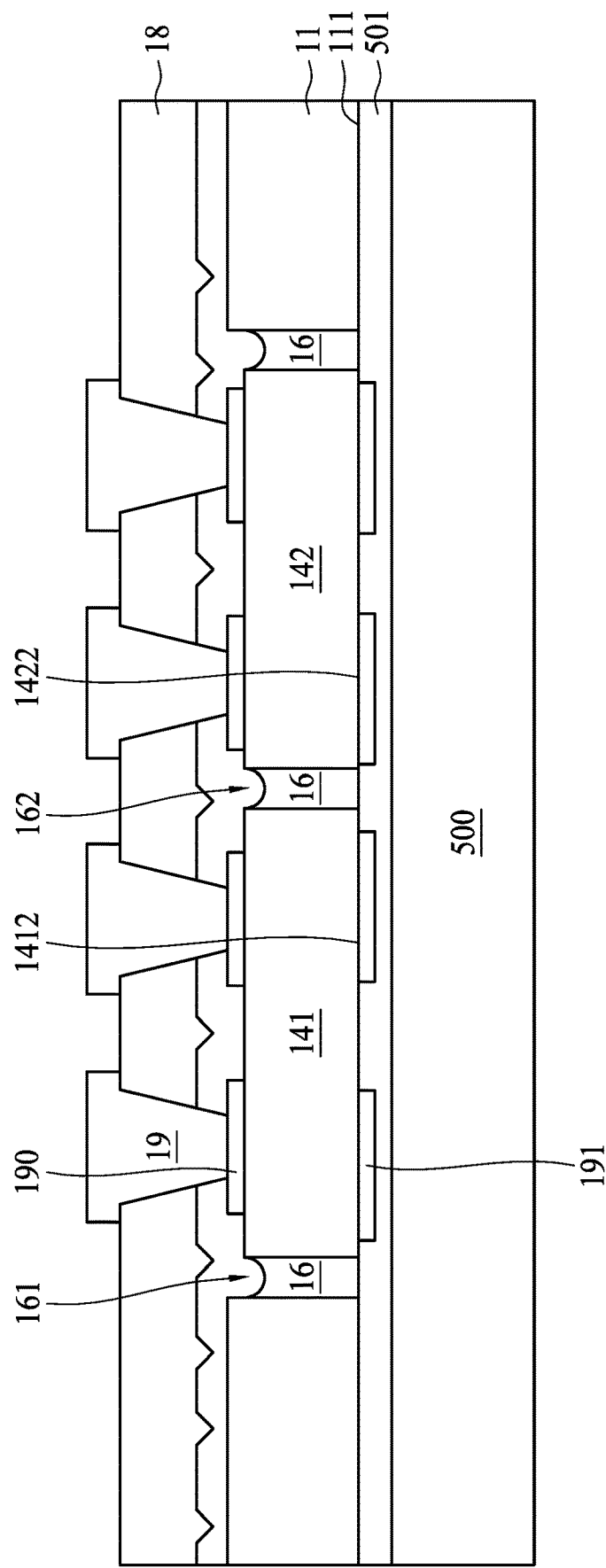

FIG. 5A to FIG. 5D are cross-section views of a semiconductor package 20 during various manufacturing operations, according to some embodiments of the present disclosure. In FIG. 5A, a temporary carrier 500 with a taping layer 501 attached to a surface thereof is provided. In FIG. 5B, a semiconductor package is formed according to the operations described in FIG. 4A to FIG. 4H over the temporary carrier 500. More than one conductive pads 191 may be located on the bottom surfaces 1412, 1422 of the first die 141 and the second die 142, respectively. The more than one conductive pads 191 may recess into the taping layer 501 during the construction of the semiconductor package according to the operations described in FIG. 4A to FIG. 4H.

Figure 5C:
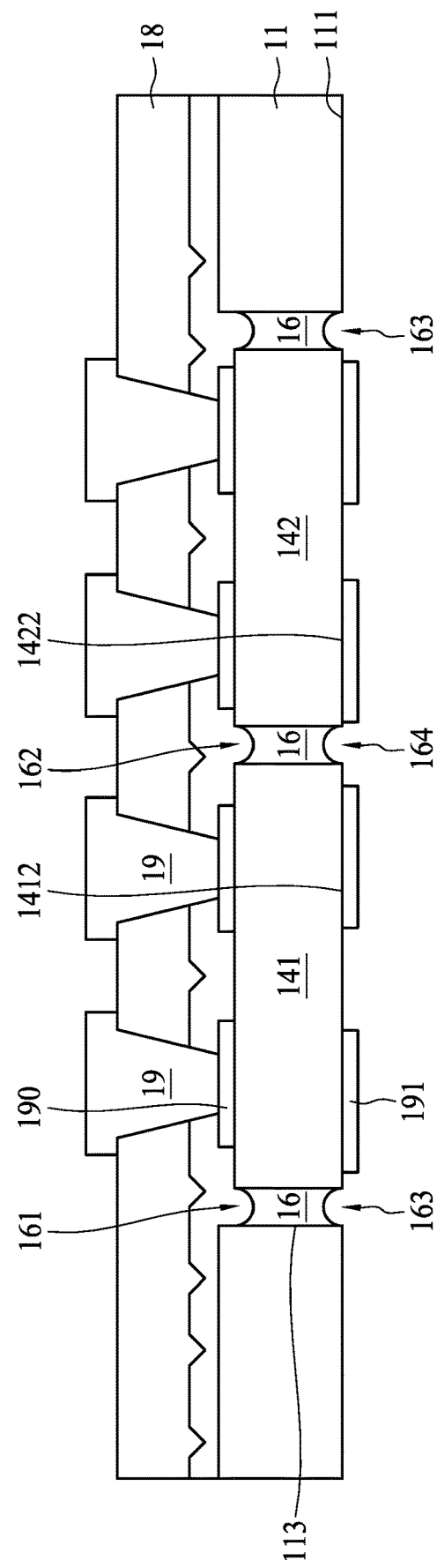
Figure 5D:
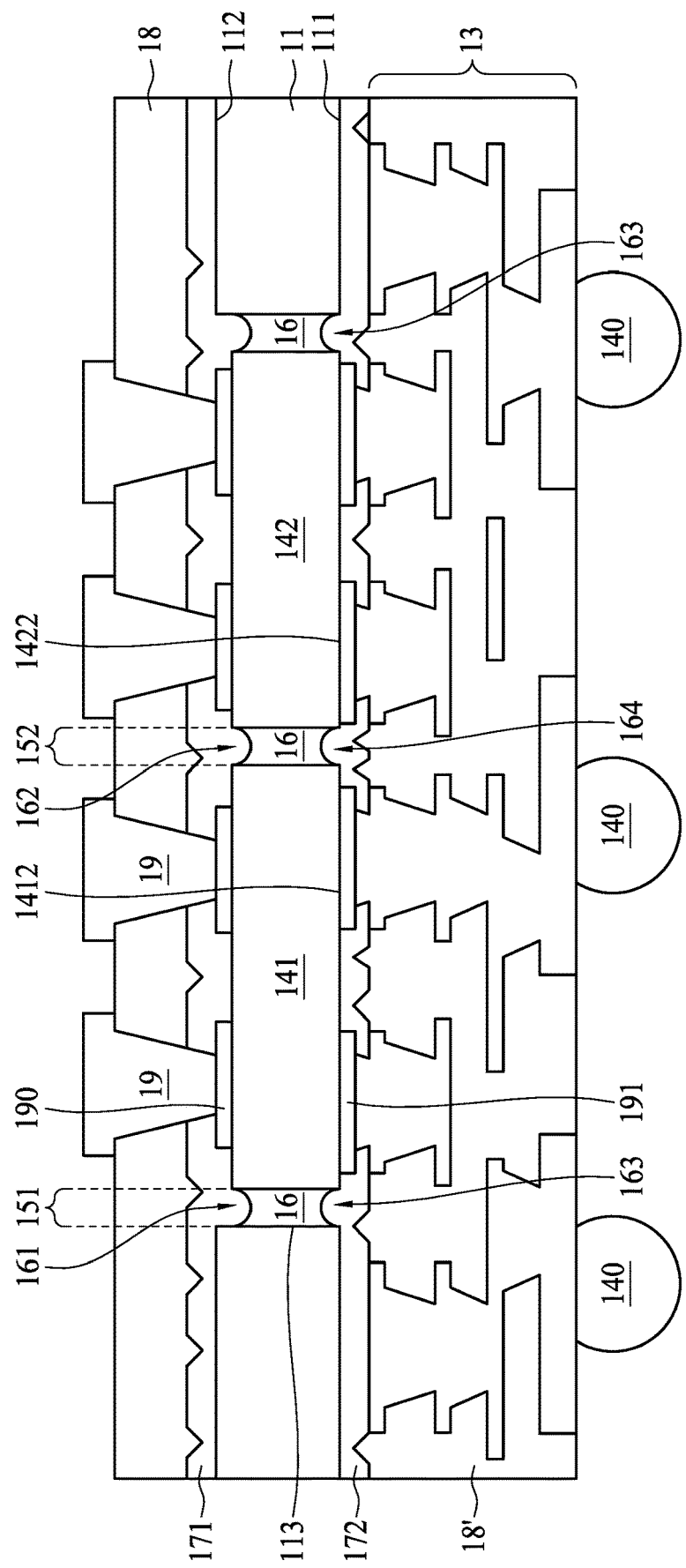

In FIG. 5C, the temporary carrier 500 and the taping layer 501 are removed from the first surface 111 of the core layer 11. A third dimple 163 and a fourth dimple 164 may appear in proximal to the first surface 111 of the core layer 11 and the bottom surface 1412 of the first die 141. The conductive pad 191 at the bottom surface 1412 of the first die 141 protrudes from the first surface 111 of the core layer 11 after the removal of the temporary carrier 500 and the taping layer 501. In FIG. 5D, a dielectric with the second viscosity, or the second buffer layer 172 referred herein, can be formed over the first surface 11 of the core layer 11 and filling into the third dimple 163 fourth dimple 164 in proximal to the first surface 11. Subsequently, a carrier 13 may be stacked over the second buffer layer 172 by taking a form of a lead frame, an organic carrier having conductive traces, or a redistribution layer (RDL) structure as illustrated in FIG. 5D. The second buffer layer 172 has a thickness greater than the conductive pads 191 at the second surfaces 1412, 1422 of the embedded dies 141, 142, the conducive pads 191 may be considered embedded in the second buffer layer 172, thereby providing protection to the conductive pads 191 during subsequent lamination operations, for example, the conductive pads 191 may not be directly contacted when stacking the second insulation layer 18' with the second buffer layer 172. The carrier 13 may be composed of a dielectric with a third viscosity, or the second insulation layer 18' referred herein. As previously discussed, the third viscosity is greater than the second viscosity, and the second viscosity is greater than the first viscosity.

Solder bumps 140 can be formed at the carrier 13 side of the semiconductor package. In some embodiments, the solder bumps 140 are electrically connected to the conducive trace terminals of the RDL structure and configured to from electrical connection to external components such as a printed circuit board (PCB).

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
 a core layer comprising a first surface and a second surface opposite to the first surface, wherein the core layer includes a cavity;
 a first die in the cavity, wherein a first gap is between a sidewall of the cavity and a sidewall of the first die;
 a filling material in the first gap, wherein the filling material includes a first dimple in proximal to the second surface of the core layer; and
 a first buffer layer on the second surface of the core layer, the first buffer layer having a bottom surface in proximal to the first die and a top surface opposite to the bottom surface, the first buffer layer filling the first dimple.

2. The semiconductor package according to claim 1, further comprising a first insulation layer on the top surface of the first buffer layer.

3. The semiconductor package according to claim 2, further comprising a trace structure in the first buffer layer and the first insulation layer.

4. The semiconductor package according to claim 2, wherein a viscosity of the first buffer layer is smaller than a viscosity of the first insulation layer.

5. The semiconductor package according to claim 1, wherein the first gap is between about 150 µm and about 500 µm.

6. The semiconductor package according to claim 1, further comprising a second die in the cavity, wherein a second gap of the cavity is between the sidewall of the first die and a sidewall of the second die, wherein the filling material fills into the second gap and includes a second dimple proximal to the second surface of the core layer, wherein the first buffer layer filling the second dimple of the filling material.

7. The semiconductor package according to claim 1, further comprising a conductive pad on a second side of the first die, the second side being closer to the first surface than to the second surface of the core layer, wherein the conductive pad on the second side protrudes from the first surface of the core layer.

8. The semiconductor package according to claim 1, further comprising a redistribution layer (RDL) structure on the first surface of the core layer and electrically connected to the first die.

9. The semiconductor package according to claim 8, further comprising:
 a second buffer layer on the first surface of the core layer and filling a third dimple of the filling material in the first gap, wherein the second buffer layer is between the core layer and the RDL.

10. The semiconductor package according to claim 9, further comprising a second insulation layer stacked with the second buffer layer.

11. The semiconductor package according to claim 8, wherein the RDL structure is connected to a conductive pad on a second side of the first die, the second side of the first die being closer to the first surface than to the second surface of the core layer.

12. The semiconductor package according to claim 11, wherein the second side of the first die is substantially leveled with the first surface of the core layer.

13. The semiconductor package according to claim 1, wherein the first die is a passive device.

14. A semiconductor package, comprising:
 a core layer comprising a first surface and a second surface opposite to the first surface, wherein the core layer includes a cavity;
 a first die disposed in the cavity, wherein a first gap of the cavity is between a sidewall of the cavity and a sidewall of the first die;
 a filling material in the first gap, the filling material including a first dimple in proximal to the second surface of the core layer;
 a buffer layer on the second surface of the core layer and filling the first dimple of the filling material;
 an insulation layer stacked on the buffer layer; and
 a conductive via penetrating the buffer layer and the insulation layer, and electrically connected to the first die, wherein the conductive via comprises:
 a first width in the buffer layer; and
 a second width at a boundary between the buffer layer and the insulation layer, wherein the first width is greater than the second width.

15. The semiconductor package according to claim 14, wherein the conductive via further comprises a third width in the insulation layer distal from the boundary between the buffer layer and the insulation layer, wherein the third width is greater than the first width.

16. The semiconductor package according to claim 15, wherein the third width is greater than the second width.

17. The semiconductor package according to claim 14, wherein the first gap is between about 150 μm to about 500 μm.

18. The semiconductor package according to claim 17, further comprising a second die in the cavity, wherein a second gap of the cavity is between the sidewall of the first die and a sidewall of the second die, wherein the filling material fills into the second gap and includes a second dimple proximal to the second surface of the core layer, wherein the first buffer layer filling the second dimple of the filling material.

19. The semiconductor package according to claim 18, wherein the second gap is between about 150 μm to about 500 μm.

20. The semiconductor package according to claim 14, further comprising a trace structure in the buffer layer and the insulation layer, the trace structure connecting to a conductive pad on a first side of the first die, the first side of the first die is closer to the second surface than the first surface of the core layer.

* * * * *